United States Patent [19]

Sato et al.

[11] 4,246,328

[45] Jan. 20, 1981

[54] PROCESS OF FORMING MASK IMAGES

[75] Inventors: Masamichi Sato; Itsuo Fujii; Toshikazu Sato, all of Asaki, Japan

[73] Assignee: Fuji Photo Film Co., Ltd., Minami-Ashigara, Japan

[21] Appl. No.: 91,276

[22] Filed: Nov. 5, 1979

Related U.S. Application Data

[63] Continuation of Ser. No. 830,974, Sep. 7, 1977, abandoned.

[30] Foreign Application Priority Data

Sep. 6, 1976 [JP] Japan ................................ 51/107013

[51] Int. Cl.$^3$ ................................................ G03C 5/00
[52] U.S. Cl. ............................................ 430/5; 430/17; 430/321; 430/323; 430/328; 430/329; 430/330; 430/421; 430/430; 430/432
[58] Field of Search ................. 430/4, 5, 17, 321, 323, 430/328, 329, 330, 421, 430, 432

[56] References Cited

U.S. PATENT DOCUMENTS

| | | | |
|---|---|---|---|
| 3,567,447 | 3/1971 | Chand | 430/5 |
| 3,748,136 | 7/1973 | Willems | 430/427 |
| 3,960,560 | 6/1976 | Sato | 430/5 |
| 3,966,473 | 6/1976 | Sato | 430/5 |
| 4,056,395 | 11/1977 | Sato et al. | 430/323 |

*Primary Examiner*—Edward C. Kimlin

*Attorney, Agent, or Firm*—Sughrue, Rothwell, Mion, Zinn & Macpeak

[57] ABSTRACT

A process of forming mask images having high contrast at the edges thereof and possessing high heat resistance and high durability comprising imagewise exposing a photographic light-sensitive material comprising a transparent support having thereon, in succession, a mask layer and a layer of an emulsion of a silver halide in a binder followed by development without employing fixing processing to form silver images at the image areas, removing the silver forming the silver images at the image areas with an aqueous solution containing ceric sulfate and sulfuric acid; then reducing the silver halide remaining at the non-image areas to silver; halogenating the silver formed in the non-image areas with an aqueous solution containing dichromate ions and halogen ions; heating the photographic material above about 200° C. to thermally decompose the binder in the silver halide emulsion layer; removing selectively the thermally decomposed binder at the image areas with a solution capable of removing the thermally decomposed binder to uncover areas of the mask layer thereunder, and thereafter removing by etching the uncovered areas of the mask layer. The mask images formed can be used for making photo masks having high resolving power and high edge contrast as well as excellent durability.

10 Claims, No Drawings

PROCESS OF FORMING MASK IMAGES

This is a continuation of application Ser. No. 830,974, filed Sept. 7, 1977, now abandoned.

BACKGROUND OF THE INVENTION

1. Field of the Invention

The present invention relates to a process of forming mask images and, more particularly, to a process of forming mask images having high resolving power, high contrast, high heat resistance, and high durability utilizing silver halide photographic images.

2. Description of the Prior Art

It is known that images of metallic silver are obtained in a silver halide photographic emulsion layer of a photographic light-sensitive material with a silver halide emulsion layer on a support by imagewise exposing and developing the photographic light-sensitive material. However, the silver images formed in a manner such as is described above are unsuitable for uses wherein high heat resistance is required since, when the silver halide emulsion layer with the silver images therein is heated to a high temperature of from about 150° to about 200° C., the binder present in the emulsion layer is thermally decomposed and discolors.

One of the fields requiring heat resistant images is super microphotography. A photographic film of a 35 mm size having a photographic image of an original of $9 \times 14$ inches ($23 \times 36$ cm$^2$) size reduced to about 1/10 thereof is usually called a "microfilm" and a photographic film having a photographic image further reduced to about 1/10 (about $2 \times 3$ mm$^2$) is usually called a "super microfilm". That is, a microfilm is a photographic film containing photographic images whose size is reduced to about 1/10 of the size of the original and a super microfilm is a photographic film containing photographic images whose size is reduced to about 1/100 of the size of the original. The term "super microfilm" or "super microphotographic film" is used in this specification with the above-described meaning.

The image size of a super microfilm is $2 \times 3$ mm$^2$ as described above or smaller and in order to project the microfilm image on a transmission type screen by enlarging to the original size, the microfilm image must be enlarged to about 100 times the size thereof (or about 10,000 times from an area standpoint the area of the microfilm image). Therefore, where the brightness of the image projected on a screen must be 100 luxes, the brightness must be 10,000,000 luxes on the images of the super microfilm when the transmission density of the screen is 1. In practice, since there is a loss of brightness due to the projection lenses, the photographic images of a super microfilm is illuminated by light of several million additional luxes. If a silver halide emulsion layer of a super microfilm containing photographic images is continuously illuminated with such an intense light, the temperature of the silver halide emulsion layer increases to a few hundred degrees (°C.) due to the heat generated by the light absorbed in the emulsion layer, which results in a decomposition of the binder present in the emulsion layer and a coloring or a darkening of the images projected on the screen. In this case, the silver image-containing areas of the emulsion layer particularly tend to absorb light and hence the temperature of these areas first increases to decompose the binder in the emulsion layer and this phenomenon spreads gradually to the surrounding areas. Even the binder at the non-image areas of the silver halide emulsion layer increases, when the binder is colored slightly, the absorption coefficient of light, which results in an acceleration of the decomposition of the binder.

Also, emulsion masks and hard masks have hitherto been used in general as photo masks for micro electronic fabrication, but emulsion masks have a low contrast at the edges of the images, a weak mechanical strength, and a low durability. Also, hard masks have a high durability but they must be prepared using a complicated process. Furthermore, in order to produce hard masks, a photoetching process is required and since the photoresist used in this case has low sensitivity, there is the disadvantage that the time required for the exposure increases.

A process described in U.S. Pat. No. 3,567,447 is known as a process of making photo masks, etc. In the process described therein, the binder portions of a photographic light-sensitive material are heated after imagewise exposure and development to form gelatin binder areas containing silver images therein on the transparent support of the photographic material and exposed areas of the transparent support without silver images, after forming a layer of a metal such as chromium over the entire surface of the photographic material, the surface thereof is treated with a metal removing solution, whereby the metal layer is removed at the above-described image-containing areas while the metal layer remains as it is at the unexposed areas of the transparent support, and then the surface is treated with an aqueous nitric acid solution, whereby the silver image-containing gelatin binder areas described above are removed to provide a photomask.

However, since in the process as described above, a metal layer such as a chromium layer is formed after forming silver image-containing gelatin binder areas by heating, it has been found that the above-described technique has the following disadvantages. That is, the means and the conditions for forming the above-described metal layer are restricted (for example, if the surface of the support is treated with a strong acid or a strong alkali for improving the adhesion of the surface and the metal layer, the binder is dissolved, which makes it difficult to treat the surface using a strong acid or strong alkali and further it is unsuitable to treat the exposed surface of the support with an abrasive powder since in such case the binder is also scraped off), the treatment procedure is complicated and unwieldy, there is a possibility of reducing the durability of the photomask obtained since the surface of the ultimately obtained metallic mask images is also etched by the above-described metal removing solution and is chemically denatured (for example, when aluminum is used as the metal and sodium hypochlorite is used for removing aluminum on the silver image portions, aluminum at the non-image areas is also removed since sodium hypochloride is an etchant for aluminum), and also the edges of the photomask images obtained are not smooth or sharp.

Thus, various intense investigations for resolving these problems as mentioned above were made and as the result thereof it was found that in the cases of imagewise exposing a photographic light-sensitive material having a mask layer and a silver halide emulsion layer formed on a transparent support followed by development and fixing, heating the binder layer of the photographic material to a high temperature to thermally decompose the binder, and selectively removing the binder on the non-image areas with a solution for removing the thermally decomposed binder (for example, an aqueous solution of sodium hypochlorite), the binder at the silver image-containing areas remained together with the silver images and was not removed and further the remaining silver image areas possess a so-called resist property, that is non-permeability to an etching solution applied to the uncovered areas of the mask layer and of substantially not being swollen by the etching solution.

Furthermore, it was also found that in the cases of imagewise exposing the photographic light-sensitive material as described above followed by development and subjecting such to a silver removing bleach treatment to form silver halide images, heating the binder layer of the photographic material to a high temperature to thermally decompose the binder, and selectively removing the binder at the non-image areas with a solution for removing the thermally decomposed binder, the binder at the silver halide image-containing portions remained together with the silver halide images without being removed and further the remaining silver halide image areas had a resist property to the etching solution applied to the uncovered portions of the mask layer.

These discoveries provided the basis for U.S. patent application Ser. No. 666,996 filed Mar. 15, 1976. That is, as described therein, a photographic light-sensitive material having a mask layer and a silver halide emulsion layer formed on a transparent support is imagewise exposed, developed, and fixed to form silver images, the photographic material is heated to temperatures higher than about 250° C., preferably higher than about 300° C., binder is removed at the non-image areas with a binder removing solution to uncover the mask layer in the areas where the gelatin is removed, and then the uncovered mask layer is removed with an etching solution. By this process, a so-called nega-posi type image composed of the mask layer remaining at the image-exposed portions is formed.

Where a posi-posi type image is desired, that is, to leave the mask layer at the non-image areas in the above-described process, a so-called reversal development is carried out. That is, after imagewise exposing and developing the photographic light-sensitive material having the above-described layer structure without applying a fixing processing thereto, the silver images obtained are removed with a bleach solution, the silver halide remaining at the non-image areas is reduced to silver, and then the photographic material is heated and subjected to the subsequent treatments as described for the above process. An aqueous solution containing an alkali metal dichromate and sulfuric acid is used as the bleach solution in the reversal development.

However, it has now been found that when the silver images are bleached with a bleaching solution containing bichromate ions, the binder is hardened at the silver image areas to cause the following difficulties. That is, it has been found that when the heating treatment, which is the step after bleach treatment, is performed at a sufficiently high temperature above about 300° C., and then the photographic material is treated with a binder removing solution, binder is selectively removed at the non-silver image areas to provide a very desirable result, while when the heating treatment is carried out at a low temperature below about 300° C., the removal speed of binder at the non-image areas decreases since the binder is hardened. Thus, it is difficult under such heating conditions to selectively dissolve off with a binder removing solution the non-silver image areas formed after the removal of silver images by bleaching.

SUMMARY OF THE INVENTION

It has now been discovered that the difference in solubility of the non-image areas in comparison with the image areas by the binder removing solution increases on heating below about 300° C. by firstly using an aqueous solution containing ceric sulfate and sulfuric acid in place of an aqueous solution containing a bichromate and sulfuric acid as the solution for removing the silver images and secondly tanning-bleaching the reversal silver images formed at the non-image areas with an aqueous solution containing bichromate ions and halogen ions. Furthermore, it has been discovered that by performing the above-described treatment only now discovered on heating to temperatures higher than about 200° C., the same result as in U.S. patent application Ser. No. 666,996 filed Mar. 15, 1976, is obtained.

An object of this invention is, therefore, to provide a process of forming mask images having high contrast at the edges as well as high heat resistance and high durability.

Another object of this invention is to provide a process of forming mask images, which can be performed in a simple manner with high sensitivity, for making photomasks having high resolving power, high edge contrast, and excellent durability.

A further object of this invention is to provide a process of forming mask images for making photomasks which have smooth surfaces, are mechanically strong and chemically stable, and are bonded strongly to the support.

Still another object of this invention is to provide a mask image forming process wherein, in the reversal treatment as in the process set forth in U.S. patent application Ser. No. 666,996 filed Mar. 15, 1976, described above, the difference in solubility between the image areas and the non-image areas is large at heating temperature conditions below about 300° C.

The various objects of this invention described above are attained by the process of this invention.

Namely, the present invention provides a process of forming mask images which comprises imagewise exposing a photographic light-sensitive material comprising a transparent support having thereon, in succession, a mask layer and a layer of an emulsion of silver halide in a binder followed by development thereof without employing a fixing process to form silver images at the image areas; removing the silver images thus formed at the image areas with an aqueous solution containing ceric sulfate and sulfuric acid; reducing the silver halide remaining at the non-image areas to silver; halogenating the silver formed in the non-image areas with an aqueous solution containing bichromate ions and halogen ions, heating the photographic material to temperatures higher than about 200° C. to thermally decompose the binder in the silver halide emulsion layer, selectively removing the thermally decomposed binder at the image areas with a solution capable of removing the thermally decomposed binder to uncover areas of the mask layer thereunder, and then removing the uncovered areas of the mask layer by etching.

According to another embodiment of this invention, this invention also provides a mask image forming process wherein in the process as described above, the silver halide at the non-image areas is reduced to silver before heating the photographic material.

DETAILED DESCRIPTION OF THE INVENTION

The photographic light-sensitive material fundamentally comprises a transparent support and a mask layer and a silver halide emulsion layer formed in the support. In the photographic light-sensitive material used in this invention, at least one subbing layer may be formed, if desired, between the mask layer and the silver halide emulsion layer. That is, the photographic material used in this invention differs from conventional silver halide photographic materials in that it has a mask layer.

The term "transparent support" as used herein designates a support which comprises a material capable of transmitting not less than about 50%, preferably not less than 70%, of electromagnetic waves in the near ultraviolet regions (from a wavelength of about 2900 Å to about 4000 Å) and the visible light regions (from a wavelength about 4000 Å to about 7500 Å). Examples of such materials are glass (e.g., quartz glass, soda lime glass, potassium lime glass, barium glass, borosilicate glass, phosphate-aluminum oxide series glass, etc.), quartz, corundum (e.g., sapphire), transparent ceramics, high-melting heat resistant polymers [e.g., poly(pyromellitic acid-p-phenylenediamineimide), poly(p-oxybenzoate), poly(ethylene-2,6-naphthalate), the polyamidoimides as described in U.S. Pat. No. 3,554,984, and the polyimidoimines as described in U.S. Pat. No. 3,472,815], etc. A suitable thickness for the support is about 50 $\mu$m to about 10 mm.

The mask layer is formed by depositing a mask material on the transparent support as described above using, e.g., vacuum evaporation, sputtering, ion plating, chemical plating, etc. Examples of the mask material which can be used in this invention are metal oxides such as silicon monoxide, chromic oxide, ferric oxide, ferromagnetic iron oxide [iron(III) oxide iron(II) oxide], cuprous oxide, and cupric oxide; metals such as chromium, aluminum, silver, titanium, cobalt, tungsten, tellurium, nickel, and a nickel-chromium alloy; semimetals such as silicon, germanium, etc.; the combinations thereof (e.g., Cr—$Cr_2O_3$, Co—$Co_2O_3$, Si—$SiO_2$, Si—Ge, etc.) and chalcogens such as As-S-Ge, As-Se-Ge, Ge-Se and Ge-S. The "silver stained glass layer" as disclosed in U.S. Pat. No. 3,732,792 can also be used as a mask layer on a support.

It is preferred for the mask layer to be inert to the silver halide in the silver halide emulsion formed on the mask layer. However, when a subbing layer is formed on the mask layer as will be explained hereinafter, the mask layer need not necessarily be inert to the silver halide.

The thickness of the mask layer depends upon the end-use but generally ranges from about 0.01 $\mu$m to about 5.0 $\mu$m, preferably from 0.05 $\mu$m to 3.0 $\mu$m. If the thickness of the mask layer is too thin, the absorption of ultraviolet light decreases, while if the thickness of the mask layer is too thick, etching becomes difficult and a side etching problem occurs. Since the materials such as metals, metal oxides, semimetals, chalcogen glasses, etc., have a very high mechanical strength as compared with a photographic emulsion layer, the use of such materials as the mask layer provides the photo mask obtained ultimately with abrasion resistance.

In this invention, the silver halide emulsion layer may be applied directly on the mask layer but it may be applied on at least one subbing layer formed on the mask layer. The subbing layer used for such purpose is a layer of a material which strongly adheres to both the mask layer and the silver halide emulsion layer. When the properties of the support differ markedly from those of the silver halide emulsion layer or those of the mask layer and the silver halide emulsion layer, two or more subbing layers may be employed if necessary. Gelatin, gelatin derivatives, albumin, casein, cellulose derivatives, starch derivatives, sodium alginate, polyvinyl alcohol, poly-N-vinyl pyrrolidone, polyacrylic acid copolymers, polyacrylamide, etc. can be used as materials for the subbing layer. A suitable total thickness for the subbing layer or layers can range from about 10 Å to about 0.5$\mu$.

The silver halide emulsion used in this invention is obtained by dispersing silver halide in an equeous solution of a water-soluble binder. Suitable silver halides which can be used are silver chloride, silver bromide, silver iodide, silver chlorobromide, silver iodobromide, silver chloroiodide, and silver chloroiodobromide. A typical silver halide emulsion which can be used in this invention is a silver halide emulsion containing more than about 90 mole percent silver bromide (preferably containing less than about 5 mole percent silver iodide), wherein the mean grain size of the silver halide is less than about 0.1 micron (i.e., a so-called Lipmann emulsion) and the ratio of the water-soluble binder to the silver halide ranges from about 1:4 to about 8:1 by weight. Another example of a silver halide emulsion which can be used in this invention is a silver halide emulsion containing more than about 90 mole percent silver bromide (containing, preferably, less than about 5 mole percent silver iodide), wherein the mean grain size of the silver halide is less than about 1 $\mu$m, and the ratio of the water-soluble binder to the silver halide ranges from about 1:6 to about 6:1 by weight. Still another example of a silver halide emulsion which can be used in this invention is a silver halide emulsion containing more than about 50 mole percent silver chloride (preferably more than 70% silver chloride), wherein the mean grain size of the silver halide is less than about 1 $\mu$m and the ratio of the water-soluble binder to the silver halide ranges from about 1:6 to about 6:1 by weight.

Examples of suitable water-soluble binders which can be used include, for example, gelatin, colloidal albumin, casein, carboxymethyl cellulose, hydroxyethyl cellulose, agar agar, sodium alginate, starch derivatives, and synthetic hydrophilic colloids such as polyvinyl alcohol, poly-N-vinylpyrrolidone, polyacrylic acid copolymers, polyacrylamide, and derivatives thereof. If desired, two or more compatible kinds of these binders may be used as a mixture thereof.

Preferably the silver halide emulsion used in this invention is optically sensitized using desired optical sensitizers such as, for example, the cyanine and merocyanine dyes as described in U.S. Pat. Nos. 1,346,301; 1,846,302; 1,942,854; 1,990,507; 2,493,747; 2,739,964; 2,493,748; 2,503,776; 2,519,001; 2,666,761; 2,734,900; and 2,739,149; and British Pat. No. 450,958.

The silver halide emulsion layer used in this invention can be appropriately exposed using electromagnetic waves to which the silver halide emulsion is sensitive, such as, for example, visible light, ultraviolet light, electron beams, and X-rays. In a photographic light-sensitive material containing an optically sensitized silver halide emulsion layer, it is advantageous to select light having wave lengths in the spectrally sensitized region of the silver halide emulsion as the light for exposing the silver halide emulsion layer.

The silver halide emulsions used in this invention may also be chamically sensitized using conventional techniques. Examples of chemical sensitizers which can be used for this purpose are, for example, gold compounds such as the chloroaurates and gold trichloride described in U.S. Pat. Nos. 2,399,083; 2,540,085; 2,597,856; and 2,597,915, the salts of noble metals as platinum, palladium, iridium, rhodium, ruthenium, etc., described in U.S. Pat. Nos. 2,448,060; 2,540,086; 2,566,245; 2,566,263; and 2,598,079, the sulfur compounds capable of forming silver sulfide by the reaction with silver salts as described in U.S. Pat. Nos. 1,574,944; 2,410,689; 3,189,458; and 3,501,313, and stannous salts, amines, and other reducing substances as described in U.S. Pat. Nos. 2,487,850; 2,518,698; 2,521,925; 2,521,926; 2,694,637; 2,983,610; and 3,201,254.

Furthermore, for preventing the occurrence of a reduction in sensitivity and an occurrence of fog during the production, storage or processing of the photographic light-sensitive materials used in this invention, various additives may be added to the silver halide emulsions. For example, such additives include 4-hydroxy-6-methyl-1,3,3a,7-tetraazaindene, 3-methylbenzothiazole, 1-phenyl-5-mercaptotetrazole as well as various heterocyclic compounds, mercury-containing compounds, mercapto compounds, metal salts, etc.

The silver halide emulsions used in this invention may further contain the light-absorbing dyes as described in U.S. Pat. Nos. 2,527,583; 2,611,696; 3,247,127; and 3,260,601.

The silver halide emulsion layers can be advantageously hardened with a suitable hardening agent for a hydrophilic colloid, for example, a formaldehyde type hardening agent; a halogen-substituted fatty acid such as mucochloric acid and mucobromic acid; a compound having many acid anhydride groups; a bisester of methanesulfonic acid; a dialdehyde and the sodium bisulfite derivative of a dialdehyde such as β-methylglutaraldehyde bis-sodium bisulfite; a bis-aziridinecarboxyamide such as trimethylene bis(1-aziridinecarboxyamide); and a triazine derivative such as 2-hydroxy-4,6-dichloro-s-triazine.

The silver halide emulsion may further contain surface active agents, individually or a mixture thereof. The surface active agents are usually used as a coating aid but, as the case may be, they can be used for other purposes. For example, they can be used for emulsifying dispersion, sensitization, improvement of photographic properties, prevention of the generation of static charges, and prevention of adhesion.

Suitable surface active agents which can be used for these purposes can be classified as natural surface active agents such as saponin; nonionic surface active agents such as alkyleneoxide series surface active agents, glycerin series surface active agents and glycidol series surface active agents, cationic surface active agents such as higher alkylamines, quaternary ammonium salts, pyridine and other heterocyclic compounds, phosphoniums, and sulfoniums; anionic surface active agents containing an acid group such as a carboxylic acid group, a sulfonic acid group, a phosphoric acid group, a sulfuric acid ester group, and a phosphoric acid ester group; and amphoteric surface active agents such as aminoacids, aminosulfonic acids, sulfuric acid esters of aminoalcohols, and phosphoric acid esters of aminoalcohols. Specific examples of these surface active agents are described in, for example, U.S. Pat. Nos. 2,271,623; 2,240,472; 2,288,226; 2,739,891; 3,068,101; 3,158,484; 3,201,253; 3,210,191; 3,294,540; 3,415,649; 3,441,413; 3,442,654; 3,475,174; 3,545,974; 3,666,478; and 3,507,660.

The silver halide emulsion can be coated on the mask layer with or without the addition of the above-described surface active agent. A suitable dry thickness for the silver halide emulsion layer thus coated preferably ranges from about 0.3 μm to about 10 μm. If desired, a backing layer, an antihalation layer, an interlayer, an uppermost layer (e.g., a protective layer), or a subbing layer may be formed on the support, the mask layer, or the silver halide emulsion layer.

Silver images are formed in the silver halide emulsion layer using ordinary photographic processing. That is, after imagewise exposure, the silver halide emulsion layer is developed.

Suitable developing agents for forming silver images, which can be used in the process of this invention are dihydroxybenzenes and polyhydroxybenzenes (for example, hydroquinone, 2-chlorohydroquinone, 2-bromohydroquinone, 2-isopropylhydroquinone, toluhydoquinone, 2-phenylhydroquinone, 2,3-dichlorohydroquinone, 2,5-dimethylhydroquinone, pyrogallol, etc.), 3-pyrazolidones (for example, 1-phenyl-3-pyrazolidone, 1-phenyl-4-methyl-3-pyrazolidone, 1-phenyl-4,4-dimethyl-3-pyrazolidone, 1-phenyl-4-ethyl-3-pyrazolidone, 1-phenyl-5-methyl-3-pyrazolidone, etc.), aminophenols (for example, o-aminophenol, p-aminophenol, o-(methylamino)phenol, p-(methylamino)phenol, p-(diethylamino)phenol, 2,4-diaminophenol, p-(benzylamino)phenol, etc.), ascorbic acid, 1-aryl-3-aminopyrazolines [for example, 1-(p-hydroxyphenyl)-3-aminopyrazoline, 1-(p-methylaminophenyl)-3-pyrazoline, 1-(p-aminophenyl)-3-pyrazoline, 1-(p-amino-m-methylphenyl)-3-aminopyrazoline, and N-(p-hydroxyphenyl)glycine. These developing agents can be used individually or as an appropriate combination thereof. A suitable pH of the developer used is higher than about 8, preferably in the range from 8.5 to 12.5.

The developer used in this invention may further contain, if desired, the following additives. That is, an alkali agent (e.g., a hydroxide of an alkali metal or ammonia, a carbonate of an alkali metal or ammonia, and a phosphate of an alkali metal or ammonia), a pH controlling agent or a buffering agent (e.g., a weak acid such as acetaic acid and boric acid, a weak base, and the salts thereof), a development accelerator (e.g., the various piridinium compounds and cationic compounds as described in U.S. Pat. Nos. 2,648,604 and 3,671,247; potassium nitrate, sodium nitrate; the polyethylene glycols and the derivatives thereof as described in U.S. Pat. Nos. 2,533,990; 2,577,127; and 2,950,970; nonionic compounds represented by the polyethioethers as described in British Pat. Nos. 1,020,033 and 1,020,032; pyridine; organic amines such as ethanolamine, etc.; benzyl alcohol; hydrazines, etc.); an antifoggant (e.g., alkali metal bromides; alkali metal iodides; nitrobenzimidazoles as described in U.S. Pat. Nos. 2,496,940 and 2,656,271; mercaptobenzimidazole; 5-methylbenzotriazole; 1-phenyl-5-mercaptotetrazole; the compounds for rapid processing as described in U.S. Pat. Nos. 3,113,864; 3,342,596; 3,295,976; 3,615,522 and 3,597,199; the thiosulfonyl compounds as described in British Pat. No. 972,211; and the phenazine-N-oxides as described in Japanese patent publication No. 41,675/-71); the stain or sludge preventing agents as described in U.S. Pat. Nos. 3,161,513 and 3,161,514 and British Pat. Nos. 1,030,442;

1,144,481 and 1,251,558; preservatives (e.g., sulfites, hydrogensulfites, hydroxylamine hydrochloride, formaldehyde-sulfite additives, and ethanolaminesulfite additives); and surface active agents.

Thus, silver images are formed in the silver halide emulsion layer using known processing. In this case, silver halide remains together with the binder at the unexposed areas.

The photographic material with silver images formed at the image areas of the silver halide emulsion layer and with silver halide remaining at the non-image areas thereof thus formed in the manner as described above in detail is then processed in an aqueous solution containing ceric sulfate and sulfuric acid to bleach the above-described silver image areas. (Hereinafter, for simplicity this bleaching step is called "the first bleaching").

The bleaching solution used in the first bleaching in this invention is fundamentally an aqueous solution containing ceric sulfate and sulfuric acid. A suitable proportion of ceric sulfate is about 2 to about 200 g/liter, preferably about 4 to 100 g/liter and a suitable proportion of sulfuric acid of a concentration of 98 wt.% is about 2 to 200 ml/liter, preferably 5 to 150 ml/liter, although other proportions than those described above may be employed. Also, a suitable temperature for the first bleaching ranges from about 10° C. to about 60° C. but other temperatures outside this range may be also employed. The processing period of time depends upon the temperature of the first bleaching solution and the composition of the first bleaching solution but is generally in the range of a few seconds to about 30 minutes. Also, the first bleaching solution may further contain, if desired, preservatives, buffering agents, etc., (e.g., acetic acid, sodium sulfate, etc.).

The photographis material in which the silver images in the image areas of the silver halide emulsion layer were removed is uniformly exposed to light and developed to reduce the silver halide at the non-image areas to silver. Also, the developer used may be a developer which is the same as that used in the development of image areas described above or may be any other type of developer. Furthermore, when a fogging developer usually used in photographic reversal development is used as the developer in this case, the above-described overall exposure is unnecessary.

Then, the silver at the non-image areas is bleached with an aqueous solution containing bichromate ions and halogen ions and is re-halogenated, whereby the binder at the non-image areas (silver image areas) is hardened. (Hereinafter, for simplicity this step is called "the second bleaching"). A suitable temperature for this bleaching can range from about 10° to 60° C., preferably 15° to 40° C., most preferably room temperature for about 10 sec. to 10 min.

Preferred examples of bleaching solutions which can be used in the second bleaching are an aqueous solution containing one or more sources of bichromate ions such as potassium bichromate, sodium bichromate, ammonium bichromate, and chromic acid and one or more sources of halogen ions such as sodium chloride, potassium chloride, potassium bromide, etc. A suitable bichromate ion concentration can range from about 0.5 g/l to a saturated solution, preferably 5 to 100 g/l. A suitable halide concentration ranges from about 1 g/l to a saturated solution, preferably 5 g/l to a saturated solution. If desired, the solution may further contain an acid such as hydrochloric acid, sulfuric acid, nitric acid, acetic acid, etc., for acidifying the solution and also a pH controlling agent, a preservative, a buffering agent, etc., (e.g., sodium carbonate, sodium phosphate, sodium hydroxide, etc.).

The silver halide at the non-image areas thus formed may be, if desired, reduced to silver images, again. The reduction may be performed by simply immersing the photographic material in a developer having the same composition as that used after the image exposure as described hereinafter and using the same processing conditions as described hereinafter. Using this procedure, the rehalogenated areas (non-image areas) are quickly reduced to silver. By the application of this reduction processing, the colorless silver halide is blackened and becomes distinctly visible, which is convenient for performing the procedure described below. The step of second bleaching and development may be repeated if desired although such a repetition is not always necessary in this invention.

As explained above in detail, the silver images formed at the non-image exposed areas of the silver halide emulsion layer or the photographic material having silver halide images are then heated to a high temperature (hereinafter, for simplicity the heating step is called "baking").

The baking may be carried out in the air, in a vacuum or in another atmosphere (for example, an atmosphere of argon, nitrogen, oxygen, hydrocarbons, halogenated hydrocarbons, etc.) and the baking temperature usually ranges from about 200° C. to about 600° C. If the baking temperature is lower than about 200° C., a longer period of time is required to finish the baking procedure while if the temperature is higher than about 600° C., the support of the photographic material may be possibly deformed and silver images or silver halide images formed may be destroyed.

With the baking treatment, the binder of the photographic material is thermally decomposed to become substantially resistant to the swelling action, softening action, and chemical action of an etching solution and also is such that it is difficult for the etching solution to permeate thereinto. That is, the binder is resistant to the etching solution and at the same time the thermally decomposed binder at the image exposed areas from which the silver was removed by the first bleaching step is selectively removed using a solution for removing the thermally decomposed binder as will be described later.

It has been discovered that by performing the first bleaching and the second bleaching based on the process of this invention, the difference in solubility between the image exposed areas and the non-image exposed areas in a binder removing solution becomes surprisingly large even on heating at temperatures lower than about 300° C. (e.g., about 5 to 10 timers larger in comparison with that in U.S. patent application Ser. No. 666,996, filed Mar. 15, 1976), and only the binder at the image exposed areas is removed to leave good images at the non-image exposed areas. Furthermore, it has also been found that by applying the heat treatment or baking treatment in this invention at heating temperature higher than about 200° C., almost the same result as in applying the heat treatment at temperatures higher than about 300° C. in the conventional process is obtained with this low-temperature heat treatment. As the matter of course, the same result is also obtained in heat treatment at temperatures of about 300° to about 600° C.

The baking treatment is performed for a such period of time that the binder of the photographic material is thermally decomposed to act as a resist and the binder becomes selectively removable with a solution for removing the thermally decomposed binder as described above. The baking period of time thus depends upon the baking temperature, and for example, is preferably about 30 to about 60 minutes at about 200° C., about 10 to about 30 minutes at about 250° C., and about 4 to about 20 minutes at about 300° C. when the binder is mainly composed of a gelatin layer of a thickness of 2 μm.

After the baking treatment, the binder at the non-image portions is selectively removed using a solution for removing the decomposed binder. Suitable solutions for removing the thermally decomposed binder which can be used are an aqueous solution of a material generally known as a bleaching agent, such as an aqueous solution of sodium hypochlorite, potassium hypochlorite, sodium hypobromite, potassium hypobromite, sodium chlorite, potassium chlorite, sodium chlorate, potassium chlorate, sodium bromate, potassium bromate, etc., at a concentration from about 0.1% by weight to several tens of percent by weight, e.g., about 20 to 30% by weight.

A suitable temperature at which the solution for removing the thermally decomposed binder can be used is generally from about 15° C. to about 60° C. but the removal of the thermally decomposed binder can be performed at other temperatures outside the above-described temperature range although the operation is not as smoothly carried out as is the case when temperatures within this range are used. The period of time necessary for the removal of the thermally decomposed binder depends upon the temperature, concentration, kind, etc., of the solution for removing the thermally decomposed binder but usually ranges from about 20 seconds to about 20 minutes. Also, if the baking temperature is too low or the baking period of time is too short, the time required for removing the thermally decomposed binder may become short but such a procedure is undesirable since the non-image exposed areas which must not essentially be removed become readily removable.

U.S. Pat. No. 3,567,447 discloses that the binder at the non-silver image areas treated with the baking treatment is removed selectively by a solution for removing the thermally decomposed binder but it was known until co-pending U.S. patent application Ser. No. 666,996, filed Mar. 15, 1976 that the silver image areas or the silver halide image areas which remain without being removed become a resist to the etching solution for the masking layer. Furthermore, it is not known until now that the difference in solubility between the image exposed areas and the non-image exposed areas to the binder removal solution becomes large even with a baking treatment at temperatures lower than about 300° C. and, in particular, higher than about 200° C.

When the binder at the non-image areas is removed by the solution for removing the thermally decomposed binder to uncover thereunder the mask layer, the selective removal step of the silver halide emulsion layer is completed. The uncovered areas of the mask layer are then etched.

The etching treatment of the uncovered mask layer areas may be performed using known chemical etching treatments and a plasma etching or an ion etching also can be utilized for this purpose. That is, plasma etching or ion etching is applied to the photographic material using the remaining silver halide emulsion layer on the non-image expoded areas as a resist. When, in this case, the silver halide emulsion layer (the resist layer) on the non-image exposed areas still remains before the mask layer is completely removed at the image exposed areas by plasma etching or ion etching or begins to be removed after the complete removal of the mask layer at the image exposed areas by plasma etching or ion etching, the plasma etching or ion etching on the mask layer is performed well but if the resist is removed before the mask layer at the image exposed areas is completely removed, this step fails. Therefore, the speed of plasma etching or ion etching of the resist must be low.

The thickness of the resist layer is usually far thicker than that of the mask layer in this invention and hence the speed of plasma etching or ion etching of the resist layer does not need to be lower than the speed of plasma etching or ion etching of the mask layer. For example, when a chromium layer of a thickness of 0.1 μm is used as the mask layer and the thickness of the resist layer (the non-image uncovered areas) is 3 μm, the speed of plasma etching of the resist layer may be about 20 times higher than that of the mask layer.

After etching the uncovered area of the mask layer, the resist images remaining are removed if desired. The removal of the resist can be achieved by immersing the photographic material after finishing the etching treatment in a solution of an acid (for example, an aqueous sulfuric acid solution at about 40° to about 90° C. of a concentration of about 40 to about 98% by weight or an aqueous nitric acid solution at about 40° to about 95° C. at a concentration of about 30 to about 70% by weight), a solution of an alkali (for example, an aqueous sodium hydroxide solution at about 40° to about 60° C. at a concentration of about 10 to about 40% by weight), or a solution of a salt (for example, an aqueous sodium hypochlorite soluti at about 20° to about 60° C. at a concentration of about 4 to about 10% by weight or an aqueous potassium hypochlorite solution at about 40° to about 60° C. at a concentration of about 5 to about 10% by weight) for about 10 to about 20 minutes.

The images formed by the process of this invention are protected by the silver halide emulsion layer or the resist which is present thereon during almost the entire course of the formation of the images. Therefore, the images formed have very high quality because the silver halide emulsion layer undergoes substantially no chemical changes during the treatment and also the condition of strongly bonding the support and the mask layer can be desirably selected in the case of forming the mask layer on the support. In particular, the effect is remarkable in the photo mask formed by the process of this invention.

It has further been found that the process of this invention is quite advantageous and some of the advantages are described below.

That is, when the silver images remaining on the mask images are used without being removed therefrom, the silver images protect mechanically the mask images, whereby the mask images are difficult to scratch.

Furthermore, even when fine pin holes exist in the mask images, the pin holes are covered since the silver images are present on the mask images.

The transmission optical density of the silver images prior to the baking treatment in this invention is far lower than that of the silver images obtained using a conventional emulsion mask (because the thickness of the silver halide emulsion layer in this invention is usually about ½ to about 1/10 of that of a conventional emulsion mask) but since the binder of the silver halide emulsion layer is thermally decomposed and discolored by the baking treatment, the transmission optical density of the silver images after baking is sufficiently high. Therefore, as described above, even if pin holes are present in the mask layer, they are masked by the silver images formed on the surface. Also, even if pin holes are formed in the silver images due to the subsequent treatment of the images, the presence of the mask layer compensates for the presence of the pin holes as a whole. The possibility that the position of a pin hole in the mask layer will coincide with the position of a pin hole in the silver images is very rare and hence the images obtained have substantially no pin holes.

Moreover, it has been found that since the color of the silver images is nearly black and low surface reflection is exhibited, the silver images have the effect of preventing a surface reflection of the mask layer under the silver images. Furthermore, the silver images prior to conducting the baking treatment or the silver images after conducting the baking treatment but prior to conducting the etching treatment onto the mask layer can be utilized as reflection patterns. That is, since the lustrous mask layer is seen at the non-silver image areas and hence a sufficient contrast to the silver images exists, then the silver images can be used as reflection patterns such as, for example, a reflection encoder.

It has further been found as an unexpected advantage of this invention that the mask layer after having been baked with the silver halide emulsion layer thereon possesses a very high scratch resistance. That is, when a scratch test was applied to the surface of the mask layer prior to the baking treatment using a stylus, the mask layer was scratched but when the scratch test was applied to the mask layer after the baking treatment using the styrus at the same load as above, the formation of a scratch on the mask layer was not observed. The reason is not yet clear but this advantage even more effectively reduces difficulties from pin holes due to the presence of the silver images and the mask images as described above.

The invention is further explained by reference to the following examples but the process of this invention is not to be construed as being limited to the embodiments illustrated in the examples. Unless otherwise indicated, all parts, percents, ratios and the like are by weight.

EXAMPLE 1

Using 50 g of gelatin and 188 g of silver bromide, 1,400 ml of a silver bromide emulsion (with the mean grain size of the silver bromide being about 0.06 μm) was prepared. The silver halide emulsion thus prepared was physically ripened and then chemically ripened using sodium thiosulfate and chloroauric acid and then spectrally sensitized to light in the wavelength range of 510 n.m. to 560 n.m. by the addition of 0.15 g of 5-[2-(3-methylthiazolinylidene)ethylidene]-3-carboxymethyl rhodanine. Thereafter, the silver halide emulsion was coated at a dry thickness of about 2 μm on a chromium layer formed in a thickness of about 0.1 μm on a soda lime glass support by vacuum deposition to produce a photographic light sensitive material.

The photographic material was imagewise exposed and developed with a developer having the following composition for 5 minutes at 24° C. to form silver images.

| Developer Composition: | |
| --- | --- |
| 1-Phenyl-3-pyrazolidone | 0.5 g |
| Sodium Sulfite | 50 g |
| Hydroquinone | 12 g |
| Sodium Carbonate (monohydrate) | 60 g |
| Potassium Bromide | 2 g |
| Benzotriazole | 0.2 g |
| 1-Phenyl-5-mercaptotetrazole | 5 mg |
| Phenazine-2-carboxylic acid | 1 g |
| Water to make | 1 liter |

The photographic material with silver images thus formed therein was washed with water for 2 minutes and processed with a first bleaching solution having the following composition for 1 minute 20° C. to remove the silver images.

| First Bleaching Solution Composition: | |
| --- | --- |
| Ceric Sulfate | 10 g |
| Sulfuric Acid (98% aq. soln.) | 20 ml |
| Water to make | 1 liter |

The photographic material thus processed was washed with water for 2 minutes, uniformly exposed to light from a tungsten lamp of 10,000 lux for 10 seconds, and developed with a developer having the composition as described above for 3 minutes to reduce the silver halide at the non-image exposed areas to silver, wherein reversal silver images were obtained.

Then, the photographic material was washed with water for 2 minutes and processed with a second bleaching solution having the following composition for 1 minute at 20° C. to tanning bleach the reversal silver images followed by water washing and drying.

| Second Bleaching Solution Composition: | |
| --- | --- |
| Potassium Dichromate | 10 g |
| Hydrochloric Acid (36% aq. soln.) | 10 ml |
| Water to make | 1 liter |

The photographic material thus processed was heated to 280° C. for 20 minutes in air and after cooling to room temperature (about 20°-30° C.), the photographic material was immersed in an 0.5% aqueous solution of sodium hypochlorite for 3 minutes at 20° C. followed by water washing, whereby the gelatin at the image exposed areas was completely removed to uncover the chromium layer thereunder. In this case, the silver halide emulsion layer at the non-image exposed areas was hardly removed.

Thereafter, the photographic material was immersed in an etching solution having the following composition for about 1 minute at 20° C., whereby the uncovered chromium layer was removed.

| Etching Solution Composition: | |
| --- | --- |
| $Ce(NH_4)_2(NH_3)_6$ | 164 g |
| $HClO_4$ (70% aq. soln.) | 10 ml |
| Water to make | 1 liter |

The photographic material was washed with water, immersed in a 4% aqueous solution of sodium hypochlorite for 20 minutes at 25° C. to remove the remaining silver halide emulsion layer, washed with water, and dried to produce a chromium mask.

The chromium mask thus obtained could resolve well lines of a width of 1.5 microns.

EXAMPLE 2

By following the same procedure as described in Example 1 except that the photographic material, after processing with the second bleaching solution followed by water washing and drying, was heated to 240° C. for 30 minutes and then, after cooling to room temperature, was immersed in the 0.5% aqueous solution of sodium hypochlorite for 40 seconds at 20° C., a chromium mask was obtained.

EXAMPLE 3

After the tanning bleach with the second bleaching solution in the procedure as in Example 1, the photographic material was washed with water for 2 minutes, subjected to the overall exposure as described in Example 1, developed to reduce again the silver halide to silver, and then washed with water for 10 minutes followed by drying. The photographic material was then subjected to the heat treatment and subsequent treatments as described in Example 1. The chromium mask obtained had almost the same quality as in the case of Example 1.

While the invention has been described in detail and with reference to specific embodiments thereof, it will be apparent to one skilled in the art that various changes and modifications can be made therein without departing from the spirit and scope thereof.

What is claimed is:

1. A process of forming mask images which comprises imagewise exposing a photographic light-sensitive material comprising a transparent support having thereon in succession a mask layer and a layer of an emulsion of silver halide in a binder followed by development without employing fixing processing to form silver images at the image areas; removing the silver images at the image areas with an aqueous solution containing ceric sulfate and sulfuric acid; reducing the silver halide remaining at the non-image areas to silver; halogenating the silver formed in the non-image areas with an aqueous solution containing bichromate ions and halogen ions; heating the photographic material to temperatures higher than about 200° C. but less than about 300° C. to thermally decompose the binder in the silver halide emulsion layer; selectively removing the thermally decomposed binder at the image areas with a solution capable of removing the thermally decomposed binder to uncover areas of the mask layer thereunder; and then removing the uncovered areas of the mask layer by etching.

2. The process as claimed in claim 1, wherein the process includes reducing the silver halide of the photographic material formed by halogenating the silver at the non-image areas to silver prior to heating.

3. The process as claimed in claim 1, wherein the mask layer comprises a layer of a metal oxide selected from the group consisting of silicon monoxide, chromic oxide, ferric oxide, a ferromagnetic oxide, cuprous oxide, and cupric oxide.

4. The process as claimed in claim 1, wherein the mask layer comprises a layer of a metal selected from the group consisting of chromium, aluminum, silver, titanium, cobalt, tungsten, tellurium, nickel, and a nickel-chromium alloy.

5. The process as claimed in claim 1, wherein the mask layer comprises a layer of a semimetal selected from the group consisting of silicon and germanium.

6. The process as claimed in claim 1, wherein the mask layer comprises a layer of a material selected from the group consisting of $Cr-Cr_2O_3$, $Co-Co_2O_3$, $Si-SiO_2$ and Si-Ge.

7. The process as claimed in claim 1, wherein the mask layer comprises a layer of a chalcogen glass selected from the group consisting of As-S-Ge, As-Se-Ge, Ge-Se and Ge-S.

8. The process as claimed in claim 1, wherein the thickness of the mask layer is from about 0.01 $\mu$m to about 5.0 $\mu$m.

9. The process as claimed in claim 1, wherein the thickness of the silver halide emulsion layer is from about 0.3 $\mu$m to about 10 $\mu$m.

10. The process as claimed in claim 1, wherein the aqueous solution of ceric sulfate and sulfuric acid contains about 2 to about 200 g/liter of ceric sulfate and about 2 to 200 ml/liter of sulfuric acid of a concentration of about 98% by weight.

* * * * *